United States Patent [19]

Kumurdjian

[11] 4,366,614

[45] Jan. 4, 1983

[54] METHOD FOR CONSTRUCTING DEVICES WITH A STORAGE ACTION AND HAVING AMORPHOUS SEMICONDUCTORS

[75] Inventor: Pierre Kumurdjian, Saint Cheron, France

[73] Assignee: Commissariat a l'Energie Atomique, Paris, France

[21] Appl. No.: 244,608

[22] Filed: Mar. 17, 1981

[30] Foreign Application Priority Data

Mar. 24, 1980 [FR] France ............................... 80 06480

[51] Int. Cl.³ .......................... B01J 17/00; H01J 3/00
[52] U.S. Cl. ........................................ 29/580; 29/590; 148/1.5; 357/2; 357/65; 357/67
[58] Field of Search .................... 29/580, 590; 148/1.5; 357/2, 65, 67

[56] References Cited

U.S. PATENT DOCUMENTS

| | | | | |
|---|---|---|---|---|
| 3,611,063 | 10/1971 | Neale | | 357/2 |
| 3,619,732 | 11/1971 | Neale | | 357/2 |
| 3,675,090 | 7/1972 | Neale | | 357/2 |
| 3,886,577 | 5/1975 | Buckley | | 357/2 |
| 4,167,806 | 9/1979 | Kumurdjian | | 29/580 |

OTHER PUBLICATIONS

Wey, H. Y., Phys. Review, 13B (1976) 3495.
Schuöcker, D., J. Appl. Phys. 44 (1973) 310.

Primary Examiner—Upendra Roy
Attorney, Agent, or Firm—Kerkam, Stowell, Kondracki & Clarke

[57] ABSTRACT

Method for the production of devices having a memory action with amorphous semiconductors, comprising in sequence a substrate on which is deposited a lower electrode, an active area produced by means of an amorphous semiconductor compound and an upper electrode, comprising producing the active area in the form of a central layer constituting an active layer formed from a first amorphous semiconductor compound and at least one buffer layer placed on one of the upper and lower faces of the active layer, said buffer layers being formed from a second amorphous semiconductor compound in the form of a quaternary compound selected from the group containing germanium, tellurium, arsenic and sulphur and producing at least one of the electrodes in such a way that it constitutes the actual electrode and with a thin layer turned towards the active area constituting a barrier, wherein the actual electrodes are made from a metal chosen from the group including tungsten and tantalum which can diffuse into the buffer layers and which with the second amorphous semiconductor compound constituting the said buffer layers can form a binary compound with a hexagonal structure in such a way that the barrier necessary for stabilizing the semiconductor is formed.

9 Claims, 3 Drawing Figures

METHOD FOR CONSTRUCTING DEVICES WITH A STORAGE ACTION AND HAVING AMORPHOUS SEMICONDUCTORS

BACKROUND OF THE INVENTION

The present invention relates to a method for the construction of devices with a storage action and having amorphous semiconductors. More specifically, the present invention relates to the construction of amorphous semiconductor components used for electrical storage.

In general, amorphous semiconductor devices comprise a substrate on which is deposited a lower electrode, an active area obtained by means of an amorphous semiconductor compound and an upper electrode.

The different type of amorphous semiconductor devices, e.g. of the "pore" type or the "three layer" type, as well as the different methods for producing these have been described in French Pat. No. 2,365,888, filed on Sept. 28th, 1976 by the Commissariat a l'Energie Atomique and entitled "Method for the construction of amorphous semiconductor devices and devives utilizing the same", as well as in its certificate of addition 2,389,239 filed on Apr. 27th, 1977.

Moreover, said different semiconductor devices can have a storage action or a switching action, as a function of their construction.

Research has shown that these actions are dependant inter alia on the nature of the electrode. In particular, a good switching action can be obtained by using carbon electrodes. At present, molybdenum electrodes are used for devices with a memory action, but said electrodes have a number of disadvantages and in particular are not very suitable for this storage action. Moreover, it is difficult to deposit molybdenum if it is desired to have a layer without constraints, without defects and which does not evolve over a period of time with the electrical or thermal pulses applied to it during the use of such a device. Furthermore, this material very easily traps the oxygen present on the substrate and the different layers of other materials constituting the semiconductor, which imposes certain constraints on the deposition process during the construction of the semiconductor.

BRIEF SUMMARY OF THE INVENTION

The present invention aims at obviating these disadvantages and more particularly at making it possible to construct semiconductor devices, whose electrodes are well suited to the storage action and in which it is easy to deposit the said electrodes.

The present invention relates therefore to a method for the construction of devices with a storage action and having amorphous semiconductors of the type described hereinbefore and comprising producing the active area in the form of a central layer constituting an active layer formed from a first amorphous semiconductor compound and at least one buffer layer placed on one of the upper and lower faces of the active layer, said buffer layers being formed from a second amorphous semiconductor compound in the form of a quaternary compound selected from the group containing germanium, tellurium, arsenic and sulphur and producing at least one of the electrodes in such a way that it constitutes the actual electrode and with a thin layer turned towards the active area constituting a barrier, wherein the actual electrodes are made from a metal chosen from the group including tungsten and tantalum which can diffuse into the buffer layers and which with the second amorphous semiconductor compound constituting the said buffer layers can form a binary compound with a hexagonal structure in such a way that the barrier necessary for stabilizing the semiconductor is formed.

According to a preferred embodiment of the invention, at least one of the barrier layers is made from tantalum telluride or tungsten telluride.

According to another preferred embodiment of the invention, the first amorphous compound constituting the active layer is formed from glass having the composition $Te_{79}Ge_{17}S_2Sb_2$. The second amorphous semiconductor compound constituting the buffer layers is made from glass of composition $Te_{60}As_{25}Ge_{13}S_1$.

According to a preferred embodiment of the invention, an insulating layer is deposited on one or other of the actual electrodes. This insulating layer is preferably formed from silicon nitride. Moreover, the upper electrode can be covered with an aluminum conductive layer.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
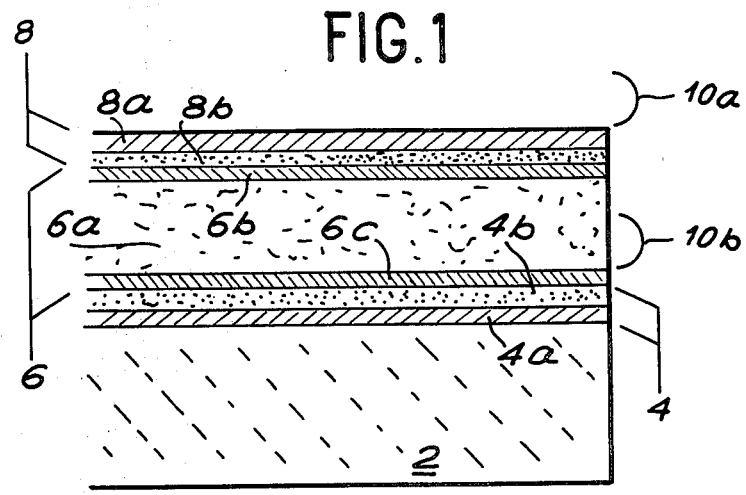
FIG. 1 diagrammatically, the different layers of materials constituting a device with a memory action according to the invention.

In FIG. 1, reference numeral 2 represents the substrate on which the semiconductor device is formed. Reference numeral 4 represents the lower electrode, reference numeral 6 the active area formed by means of an amorphous semiconductor compound and reference numeral 8 an upper electrode. Thus, as stated hereinbefore, the electrodes 4 and 8, as well as active area 6 have a more complex structure.

The lower electrode 4 comprises the actual electrode 4a which is in direct contact with substrate 2 and a thin layer 4b turned towards the active area 6 and constituting a barrier. In the same way, upper electrode 8 comprises the actual electrode 8a and a thin layer 8b constituting a barrier turned towards the active area 6, in the same way as barrier 4b.

The actual electrodes 4a and 8a are made from a metal which is able to form a binary compound with a hexagonal structure, such as tungsten or tantalum. These materials have the advantage of being suitable for the memory action. Barriers 4b or 8b are constituted by the binary compound with a hexagonal structure. In the case of tantalum electrodes, barriers 4b or 8b are made, for example, from tantalum telluride and in the case of tungsten electrodes the barriers 4b or 8b are made, for example, from tungsten telluride. These barriers 4b and 8b are necessary for the stabilization of the semiconductor.

In the same way, active area 6 is constituted by an actual active layer 6a, an upper buffer layer 6b and a lower buffer layer 6c. These buffer layers 6b and 6c prevent any diffusion of the electrode into the active area 6a. Active layer 6a is made from a tellurium-rich compound and preferably from glass with a composition $Te_{79}Ge_{17}S_2Sb_2$. In the same way, the buffer layers 6b, 6c are made from a vitreous compound, which is preferably rich in tellurium and has the composition $Te_{60}As_{21}Ge_{13}S_1$.

The presence of tellurium in the buffer layers 6b, 6c permits the formation, by diffusion of electrodes 4a, 8a into the buffer layers, of barrier layers 4b, 8b made from a binary compound with a hexagonal structure in the form of a tantalum telluride or tungsten telluride for electrodes 4a, 8a made either from tantalum or from tungsten.

In the same way, with buffer layers 6b, 6c made from a sulphur-rich vitreous compound, it is possible to obtain, by diffusion of electrodes 4a, 8a into said buffer layers, barrier layers 4b, 8b made from a binary compound with a hexagonal structure in the form of a tantalum sulphide or a tungsten sulphide for electrodes 4a, 8a made either from tantalum or from tungsten.

During the construction of a device according to the invention, as a function of the nature of the electrodes, it being possible for the electrodes of one and the same device to be of a different nature, as well as the type of characteristics desired for the amorphous semiconductor device, it is possible to deposit one or two barrier layers and/or one or two buffer layers. Thus, the barrier layer can be produced by diffusion prior to the use of the semiconductor device. In the opposite case, as soon as the device has been used, the presence of a buffer layer makes it possible to produce the barrier layer by diffusion of the metal electrode able to diffuse into said buffer layer. In FIG. 1, reference numeral 10 corresponds to an insulating layer, preferably made from silicon nitride and which can either be placed on part of the upper electrode 8, said layer being indicated by 10a, or on part of the lower electrode 4, said layer then being indicated by 10b. The position of insulating layer 10 is dependent on the type of device being produced.

Figure 2:
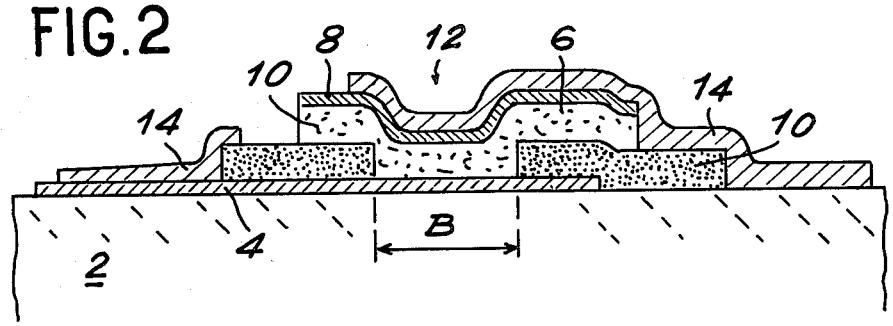
FIG. 2 diagrammatically, a first embodiment of a device with a memory action according to the invention.

The device according to the invention, shown in FIG. 2, of the "three layer" type. This device is obtained by depositing the three layers corresponding to the two electrodes 4 and 8 and the active area 6, as described hereinbefore, on the substrate 2 in accordance with per se known processes. When deposition has taken place, the three layers 4, 6 and 8 are etched to the template of the lower electrode 4, e.g. by mechanical erosion and by the dry method. This is repeated for the upper electrode 8, so as to give it its final size.

In the following stage and using any per se known means, a uniform deposit of an insulating material is formed which constitutes the insulating layer 10. Layer 10 can be constituted by any compound, except an oxide. Preferably, insulating layer 10 is formed from silicon nitride.

The following stage consists of etching the insulating layer 10, e.g. by argon bombardment. A slot 12 is also made in insulating layer 10 above the upper electrode 8.

In the following stage, conductor material 14 is uniformly deposited. This deposit is then etched to seperate the conduction of the lower electrode 4 and the upper electrode 8. Thus, the active area A is defined by the surface of upper electrode 8.

Figure 3:
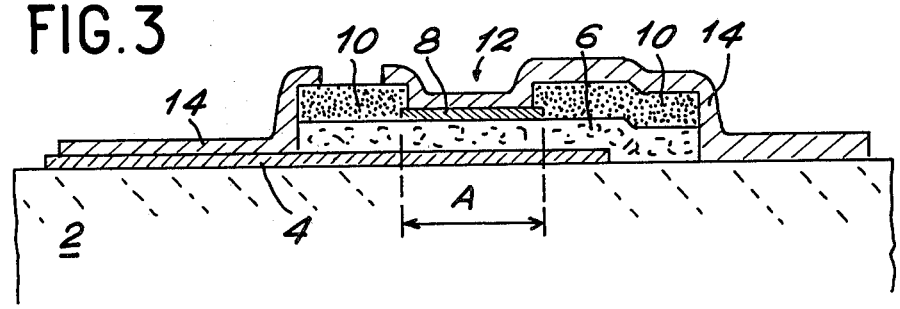
FIG. 3 diagrammatically, a second embodiment of a device with a memory action according to the invention.

The device according to the invention shown in FIG. 3 corresponds to a "pore" type device. This device is obtained by depositing lower electrode 4 on substrate 2, then by etching this deposit to give it the desired form. The insulating layer is then deposited in uniform manner and is preferably made from silicon nitride. As hereinbefore, layer 10 is then etched to provide slot 12 defining the active area B of the semiconductor device. This is followed by the deposition of active layer 6 and conductive layer 14. Finally, conductive layer 14 and active layer 6 are etched to disengage the electrical connection flats. The conductive layer 14 is made, for example, from aluminium.

Reference can be made to the patent specifications referred to hereinbefore for more details on the method for producing a device of the "pore" type or the "three layer" type.

Depending on the nature of the electrodes, as well as the nature of the buffer layers, the composition of the barrier layer in the form of a binary compound with a hexagonal structure can differ. For example, for a tellurium-rich buffer layer, a $WTe_2$-type compound is obtained for a tungsten electrode and a $TaTe_2$-type compound for a tantalum electrode. For a sulphur-rich buffer layer and a tantalum electrode, a $TaS_2$-type compound is obtained, whilst a $WS_2$-type compound is obtained for a tungsten electrode. The advantage of such compounds is that, due to their structure, they are very good diffusion retardants.

What is claimed is:

1. A method for the production of devices having a memory action with amorphous semiconductors, comprising in sequence a substrate on which is deposited a lower electrode, an active area produced by means of an amorphous semiconductor compound and an upper electrode, comprising producing the active area in the form of a central layer constituting an active layer formed from a first amorphous semiconductor compound and at least one buffer layer placed on one of the upper and lower faces of the active layer, said buffer layers being formed from a second amorphous semiconductor compound in the form of a quarternary compound selected from the group consisting of germanium, tellurium, arsenic and sulphur and producing at least one of the electrodes that it constitutes the actual electrode and with a thin layer turned towards the active area constituting a barrier, wherein the actual electrodes are made from a metal chosen from the group consisting of tungsten and tantalum which can diffuse into the buffer layers and which with the second amorphous semiconductor compound constituting the said buffer layers can form a binary compound with a hexagonal structure forming the barrier necessary for stabilizing the semiconductor.

2. A method according to claim 1, wherein the barrier is made from tantalum telluride.

3. A method according to claim 1, wherein the barrier is made from tungsten telluride.

4. A method according to claim 1, wherein the first amorphous compound constituting the actual active layer is made from glass with the composition $Te_{79}Ge_{17}S_2Sb_2$.

5. A method according to claim 1, wherein the second amorphous semiconductor compound constituting the buffer layers is made from glass of composition $Te_{60}As_{25}Ge_{13}S_1$.

6. A method according to claim 1, wherein an insulating layer is deposited on the actual upper electrode.

7. A method according to claim 1, wherein an insulating layer is deposited on the actual lower electrode.

8. A method according to claims 6 or 7, wherein the insulating layer is made from silicon nitride.

9. A method according to claim 1, wherein the actual upper electrode is covered with an aluminium conductive layer.

* * * * *